United States Patent

Blaker et al.

Patent Number: 5,550,870
Date of Patent: Aug. 27, 1996

[54] VITERBI PROCESSOR

[75] Inventors: David M. Blaker, Emmaus, Pa.; Gregory S. Ellard, Forest Park, Great Britain; Mohammad S. Mobin, Whitehall, Pa.

[73] Assignee: Lucent Technologies Inc., Murray Hill, N.J.

[21] Appl. No.: 205,961

[22] Filed: Mar. 2, 1994

[51] Int. Cl.⁶ .................................................. H04L 27/06
[52] U.S. Cl. ............................................. 375/341; 371/43
[58] Field of Search ........................ 375/94, 39, 341, 375/262; 371/43; 364/715.08, 745

[56] References Cited

U.S. PATENT DOCUMENTS

| | | | |
|---|---|---|---|
| 4,240,156 | 12/1980 | Doland | 371/43 |
| 4,346,473 | 8/1982 | Davis | 371/43 |
| 4,493,082 | 1/1985 | Cumberton et al. | 371/43 |
| 5,065,411 | 12/1991 | Muto | 375/347 |
| 5,134,635 | 7/1992 | Hong et al. | 375/94 |
| 5,144,644 | 9/1992 | Borth | 375/96 |

FOREIGN PATENT DOCUMENTS

| | | |
|---|---|---|
| 0413505 | 2/1991 | European Pat. Off. . |
| 0430428 | 6/1991 | European Pat. Off. ........ H03M 13/12 |
| 0467522 | 1/1992 | European Pat. Off. . |

OTHER PUBLICATIONS

"Digital Communications Fundamentals and Applications" Bernard Sklar, Prentice Hall, 1988, pp. 333–341.

Patent Abstracts of Japan vol. 012 No. 060 (E–584), 23 Feb. 1988 and JP–A–62 203427 (NEC Corp) 8 Sep. 1987 *Abstract*.

Patent Abstracts of Japan vol. 011 No. 113 (E–497), 9 Apr. 1987 and JP–A–61 261931 (Mitsubishi Electric Corp) 20 Nov. 1986, *Abstract*.

Patent Abstract of Japan vol. 014 No. 511 (E–0999), 8 Nov. 1990 and JP–A–02 211724 (Matsushita Electric Ind Co. Ltd) 23 Aug. 1990, *Abstract*.

*Primary Examiner*—Tesfaldet Bocure
*Attorney, Agent, or Firm*—John T. Rehberg

[57] ABSTRACT

A digital signal processor with an embedded error correcting coprocessor (ECCP) is disclosed. The ECCP provides soft symbol Viterbi decoded outputs which have the absolute value of the accumulated cost difference of competing states concatenated with the traceback bit or most significant bit of the next state.

7 Claims, 3 Drawing Sheets

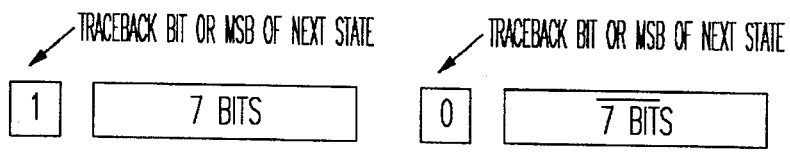
FIG. 5
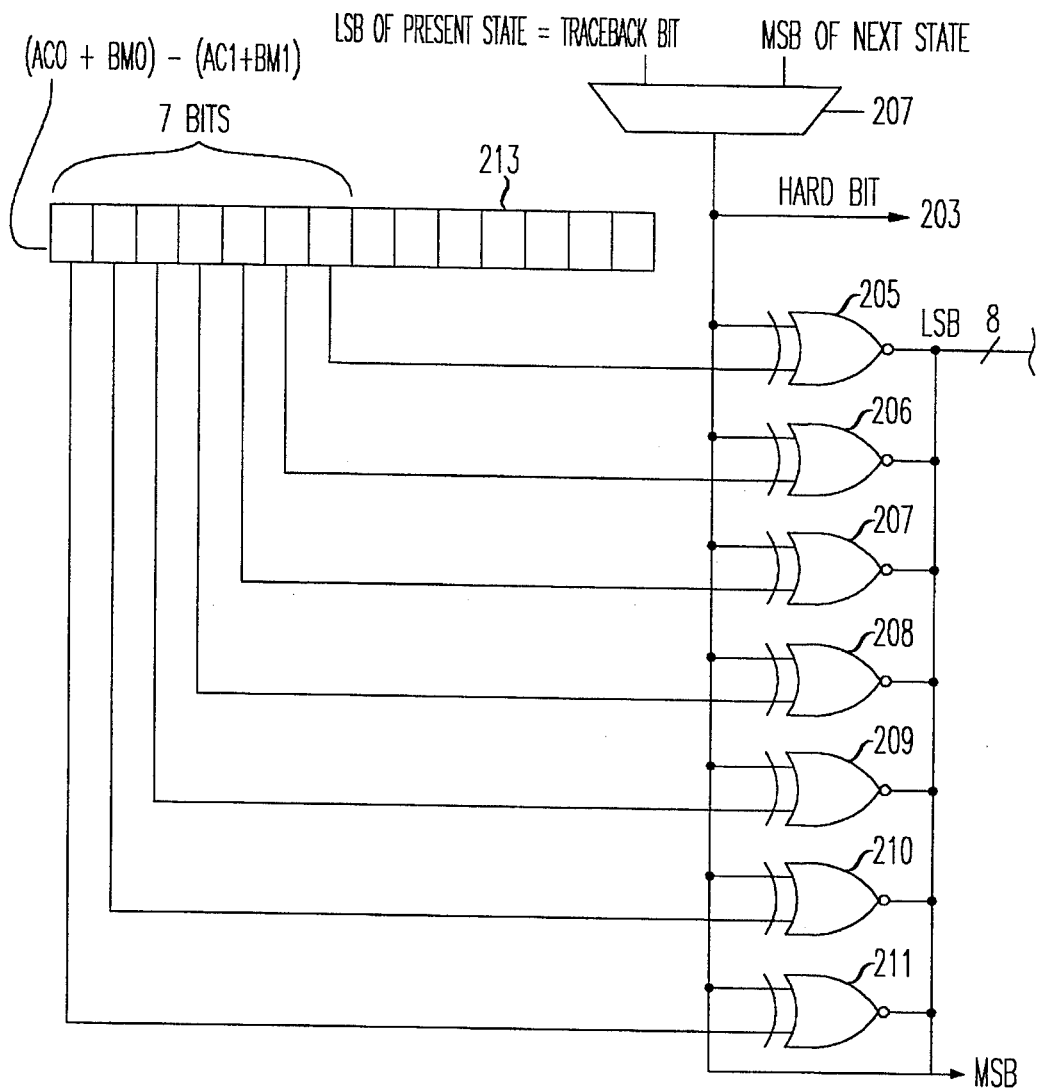
FIG. 6
FIG. 7
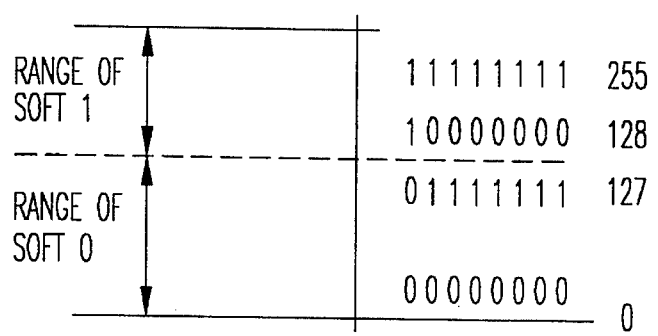

VITERBI PROCESSOR

CROSS-REFERENCE TO RELATED APPLICATIONS

This application is related to the following previously filed, applications, each of which is incorporated herein by reference:

application Ser. No. 08/153334, entitled "Efficient Utilization of Present State/Next State Registers", filed Nov. 16, 1993, issued as U.S. Pat No. 5,467,275, on Nov. 7, 1995 by D. Blaker, M. Diamondstein, G. Ellard, M. Mobin, H. Sam and M. Thierbach, our docket number Blaker 3-2-3-3-4-10;

application Ser. No. 08/152531, entitled "Variable Length Tracebacks", filed Nov. 16, 1993, by D. Blaker, G. Ellard, and M. Mobin, our docket number Blaker 4-4-4;

application Ser. No. 08/153333, entitled "Power and Time Saving Initial Tracebacks", filed Nov. 16, 1993, issued as U.S. Pat. No. 5,490,178, on Feb. 6, 1996, by D. Blaker, G. Ellard, and M. Mobin, our docket number Blaker 6-6-6;

application Ser. No. 08/152805, entitled "Digital Receiver with Minimum Cost Index Register", filed Nov. 16, 1993, issued as U.S. Pat. No. 5,513,220 on Apr. 30, 1996, by D. Blaker, G. Ellard, M. Mobin and H. Sam, our docket number Blaker 2-2-2-3;

application Ser. No. 08/153,405, entitled "Digital Processor and Viterbi Decoder Having Shared Memory", filed Nov. 16, 1993, issued as U.S. Pat. No. 5,432,804 on Jul. 11, 1995, by M. Diamondstein, H. Sam and M. Thierbach, our docket number Diamondstein 1-2-8;

application Ser. No. 08/153391, entitled "Digital Signal Processor", filed Nov. 16, 1993, by D. Blaker, G. Ellard and M. Mobin, our docket number Blaker 1-1-1; and application Ser. No. 08/152,807, entitled "Digital Signal Processor", filed Nov. 16, 1993, issued as U.S. Pat. No. 5,454,014 on Nov. 26, 1995, by D. Blaker, G. Ellard, M. Mobin and M. Thierbach, our docket number Blaker 5-5-5-9.

TECHNICAL FIELD

This invention relates generally to digital processors.

BACKGROUND OF THE INVENTION

Cellular telephones m increasingly moving to digital transmission techniques of various types. One digital standard (GSM) has been generally adopted for use in Europe, while another (IS54) is intended for use in North America (a time-division multiple access standard—in addition, code-division multiple access systems are under consideration for North America), with still others such as the Japan Digital Cellular standard under consideration. However, the nature of cellular transmission and reception, often occurring from moving vehicles or pedestrians, gives rise to a variety of channel disturbances. For example, multi-path interference exists when reflections from various objects causes several signal, delayed in time from the original signal, to be received. Therefore, the received digital sequence may not exactly match the transmitted sequence. The digital sequences are sent in "packets" having a desired number of digital bits, which may be fixed, or alternatively variable, in order to compensate for transmission difficulties. For example, the packet may contain a fixed number of "training" bits along with information bits. The above-noted standards require various forms of Forward Error Correction (FEC), by which additional bits are included in the packets to provide a degree of redundancy in transmission, so that errors may be detected and corrected to some degree at the receiving end. The packets may contain digitized voice information or other forms of data, including computer files, video information, etc.

Mobile communication devices, such as mobile digital cellular telephones, often employ digital signal processors for processing and filtering received and transmitted digital signals. Often, a separate chip is provided to implement a Viterbi process for correcting errors or decoding incoming signals. Sometimes the process is implemented in software.

The Viterbi process is a maximum likelihood decoding process that provides forward error correction. The Viterbi process is used in decoding a bit stream sequence of encoded signals or signals which have been corrupted by intersymbol interference or noise. The bit stream may represent encoded information in a telecommunication system transmission through various media with each set of bits representing a symbol instant. In the decoding process, the Viterbi algorithm works back through a sequence of possible bit sequences at each symbol instant to determine which one bit sequence is most likely to have been transmitted. The possible transitions from a bit state at one symbol instant to a bit state at a next, subsequent symbol instant is limited. Each possible transition from one state to a next state may be shown graphically as a trellis and is defined as a branch. A sequence of interconnected branches is defined as a path. Each state can only transition to a limited number of the next states upon receipt of the next bit in the bit stream. Thus, some paths survive and others do not survive during the decoding process. By eliminating those transitions that are not permissible, computational efficiency can be achieved in determining the most likely paths to survive. The Viterbi process typically defines and calculates a branch metric associated with each branch and employs an accumulated branch metric to determine which paths survive and which paths do not survive.

Typically, the Viterbi process is implemented on a chip which is separate from the digital processing chip (or alternatively implemented in software). Incoming signals are first routed to the Viterbi processor for decoding. The decoded signals are then routed to the digital signal processor for further processing.

As mobile communication devices proliferate, there remains a need for a faster, more efficient processing of incoming signals. The Viterbi process (together with other processes used by other types of digital processors in other applications) requires that branch metric calculations be performed. The branch metric calculation involves the computation of either the square or absolute value of the difference between two numbers. In some cases the branch metric may be an 8 bit number; in other cases, the branch metric may be a 16 bit number. Whatever the size of the branch metric, handling of all of the digits of the branch metric can be computationally expensive and time consuming inside the digital processor.

SUMMARY OF THE INVENTION

One embodiment of the present invention is a method of trellis decoding which includes the determination of two or more branch metric values which have between n and m bits. A k bit number is formed. If k<n, the n-k least significant bits are discarded. If k>n, each branch metric bit is shifted so that the most significant bit is in the k bit position and zeroes are concatenated to the least significant bit positions.

In a further embodiment the traceback bit for each symbol instant is subsequently determined and, if the traceback bit is a 1, the traceback bit is concatenated with the modified absolute accumulated cost difference, thereby obtaining a soft symbol output. If the traceback bit is a 0, the traceback bit is concatenated with the ones complement of the modified accumulated cost difference, thereby obtaining a soft symbol output. Other embodiments include formation of soft symbol outputs utilizing the most significant bit of the next state in place of the traceback bit.

BRIEF DESCRIPTION OF THE DRAWINGS

FIG. 5 is a diagram illustrating concatenation of a portion of the accumulated cost difference with a traceback bit to yield a soft symbol output;

FIG. 6 is a circuit which illustratively performs the concatenation described above to yield a soft symbol output; and FIG. 7 is a diagram illustrating the range of soft symbol outputs available in an illustrative embodiment of the present invention.

DETAILED DESCRIPTION

In decoding data using the Viterbi process from a series of real or complex binary data received at a decoder, the decoder generates the sequence of data most likely transmitted. The decoder considers all possible state combinations and produces estimates of signals for all possible state transitions and compares them with received data to determine what was the most likely transmitted bit sequence. The initial state of the encoder is known so, therefore, the decoder has a starting point. The end state of the encoder is also known, so the decoder also has a predetermined ending point. The decoder determines the most likely sequence of state transitions for the received series of binary data. Each such state represents a symbol instant. At each symbol instant, there are a number of states that range from 0 up to $2^{C-1}-1$ where C is the constraint length. A typical range for C would be from 2 to 7. These $2^{C-1}$ states will be referred to as individual states. A limited number of transitions are possible. At each symbol instant, the accumulated cost is calculated for each of the possible transitions. The trellis path having an extremum (i.e., minimum or maximum) cost may thereby be determined.

At each symbol instant, each individual state can only progress to a limited number of possible next individual states. In addition, each next individual state has only a limited number of possible previous individual states from which a transition to it can originate.

A branch metric is calculated at each symbol instant for each possible transition from all possible individual states to the next individual state. Various methods for calculating branch metrics are known in the art and will be detailed below. The branch metric for all branches transitioning to a given next individual state are calculated, then added to the accumulated cost of the respective originating individual state, resulting in two or more potential accumulated cost sums. A comparison is made of the various potential accumulated cost sums. In one embodiment of the invention the lesser of the cost sums is selected as the next state accumulated cost. (For certain branch metric calculations, the greater of the cost sums might be selected.) The transition corresponding to the lesser sum is the more likely transition from the two possible originating individual states to the given next individual state. The originating individual state of the more likely transition is stored as the surviving origin of a branch to the given next individual state. The lesser sum is the accumulated cost of the next individual state and replaces the accumulated cost for that individual state. This process is repeated for each of the next individual states and repeated also for each symbol instant until all symbols in the bit stream are decoded.

Figure 1:
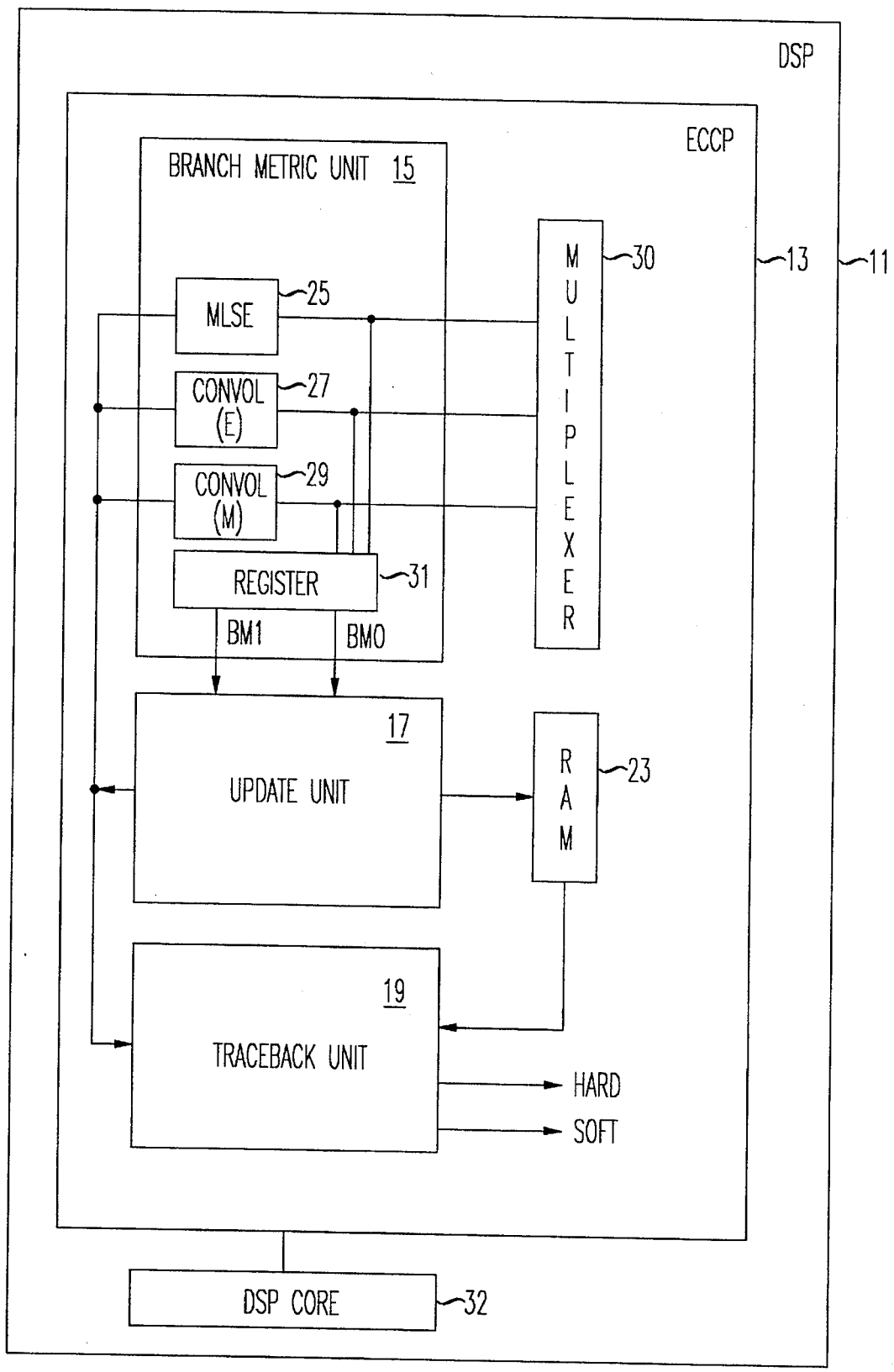
FIG. 1 is a diagram showing an illustrative embodiment of the present invention.

FIG. 1 is a schematic diagram of digital signal processor (DSP) 11 having embedded error-correcting co-processor (ECCP) 13 and a DSP core 32. DSP core 32 sets the operational parameters of the ECCP 13, such as constraint length, and branch metric type, (Euclidean or Manhattan). Core 32 also initiates the Viterbi decoding function of ECCP 13.

Within ECCP 13 is update unit 17, traceback unit 19, and branch metric unit 15. Update unit 17 performs the add compare select operations of the Viterbi process. At every symbol instant there are $2^C$ state transitions of which $2^{C-1}$ state transitions survive. The update unit performs the add-compare-select operation and updates $2^{C-1}$ accumulated cost states in RAM 23. The update unit stores the accumulated cost of each path at whatever symbol instant is under analysis.

Traceback unit 19 selects a path having the smallest path metric among $2^{C-1}$ survivor paths at every symbol instant. The last bit of the path corresponding to the maximum likelihood sequence is delivered to the decoder output. The depth of this last bit is programmable at the symbol rate. If the end state is known, the traceback decoding may be forced in the direction of the correct path by writing the desired end state into a minimum cost index register.

Branch metric unit 15 calculates, for each symbol instant, the branch metric for each possible transition.

A variety of metrics have been proposed by those skilled in the art for comparatively evaluating individual branches on the trellis. In the past, Viterbi decoders which utilize branch metric units perform the Viterbi process using a single predetermined preprogrammed metric. By contrast, the present invention provides a branch metric unit capable of utilizing a variety of metrics. Furthermore, depending upon the distance measure and code rate, the results of the branch metric calculation may produce results with different bit precision. The present invention permits handling of a wide variety of distance measures and code rates using the same hardware.

ECCP 13 may be employed to deconvolve signals which have been encoded by a convolutional encoder. In addition, ECCP 13 may be employed to provide maximum likelihood sequence estimation (MLSE) equalization.

In certain applications, ECCP 13 may be required to perform an MLSE process. (In other applications, the ECCP 13 may be required to perform a convolutional decoding as discussed below.) In wide-band width, low data rate applications, additive white gaussian noise (AWGN) is the principal channel impairment and a Euclidean branch metric provided by equation (1) is appropriate for MLSE operation. An Euclidean metric appropriate for MLSE processes is given by $$BM=(Z_I-E_I)^2+(Z_Q-E_Q)^2 \qquad (1)$$

where

BM=branch metric $Z_I$,32 received in-phase signal component $Z_Q$=received quadrature signal component $E_I$=estimated received in-phase component for each state transition $E_Q$=estimated received quadrature component for each state transition Consequently, DSP core 32 selects MLSE operation metric unit 25 with an embedded Euclidean branch metric unit. Metric unit 25 performs Euclidean metric calculations on incoming signals as part of an MLSE process.

By contrast, when convolutional decoding is to be performed, either an Euclidean or a Manhattan metric may be appropriate. For example, convolutional decoding over a gaussian channel may require a Euclidean distance measure for rate 1/1 or 1/2 encoding. By contrast, convolutional decoding preceded by MLSE or other linear/non-linear equalization may require a Manhattan distance measure for code rates 1/1 to 1/6. For convolutional decoding with a 1/1 code rate, an Euclidean metric given by equation 2 may be appropriate:

$$BM=(S_o-E_o)^2 \qquad (2)$$

where

BM=branch metric $S_o$=received signal component $E_o$=estimated signal component For convolutional decoding with a 1/2 code rate, an Euclidean metric given by equation 3 may be appropriate:

$$BM=(S_o-E_o)^2+(S_I-E_I)^2 \qquad (3)$$

where

BM=branch metric $S_o$=received first signal component $S_I$=received second signal component $E_o$, $E_I$=corresponding estimated signal component associated with each state transition By contrast, a Manhattan branch metric is provided by equation 4:

$$BM = \sum_{i=1}^{m} |S_i - E_i| \qquad (4)$$

for m=1, 2, 3, 4, 5, 6 depending upon code rate which is 1/m where

BM=branch metric $S_i$=received $i^{th}$ signal $E_i$=estimated $i^{th}$ signal (Note: higher values of m are also permissible). Consequently, when convolutional decoding requiring an Euclidean distance measure is required, metric unit 27 calculates Euclidean metrics. However, should convolutional decoding utilizing a Manhattan metric be required, operation of metric unit 29 is invoked by DSP core 32 to perform the required metric operation. Whichever metric unit 25, 27 and 29 is selected, it calculates the appropriate metric for each incoming signal. Whichever of the three metric units, 25, 27 or 29, is utilized, the output is provided to multiplexer 30 and then used in the add-compare-select operation performed by update unit 17.

Of course, additional metric units may be employed and other metrics such as Hamming may be performed by any of the metric units.

Illustratively, the branch metric unit 15 performs real and complex arithmetic for computing scaled 16 bit branch metrics required for MLSE equalization and/or convolutional decoding. MLSE branch metric unit 25 generates a set of estimated received complex signal for each symbol instant, n, using $2^C$ states of the Viterbi processor. The received complex signal may be represented by inphase and quadrature components indicated in equation 5:

$$E(n,k)=EI(n,k)+jEQ(n,k) \qquad (5)$$

where n=symbol instant k=0 . . . $2^{C-1}$1=all states taking part in Viterbi state transition C=constraint length All possible states, k=0 to k=$2^{C-1}$−1, taking part in the Viterbi state transition are convolved with the estimated channel impulse response, H(n), which is provided by equation 6.

$$H(n)=[h(n), h(n-1), h(n-2) \ldots h(n-C+1)]^T \qquad (6)$$

where H(n)=estimated channel impulse response h(n)=$n^{th}$ channel tap

C=constraint length

Each in-phase and quadrature phase part of the channel tap, h(n)=hI(n)+jhQ(n), may be an 8 bit twos complement number (although other representations are acceptable). To simplify data handling, the channel estimates may be normalized prior to loading into ECCP 15 such that the worst case summation of the hI(n) or hQ(n) are confined to be a 10 bit twos complement number (although other representations are possible). In addition, the in-phase and quadrature phase parts of the received complex signal, Z(n)=ZI(n)+jZQ(n) are also confined in a similar manner to be a 10 bit twos complement number. The Euclidean branch metric associated with each of the $2^C$ state transitions, originally expressed as equation 1, may be rewritten as:

$$BN(n,k)=XI(n,k)^2+XQ(n,k)^2 \qquad (7)$$

where XI(n,k)=abs{ZI(n)−EI(n,k)}

XQ(N,k)=abs{ZQ(n)−EQ(n,k)} where XI, and XQ have an upper saturation limit of OXFF (=$255_{10}$)

To prevent the occurrence of arbitrarily large branch metrics, the values of XI and XQ are not permitted to exceed OXFF (i.e., $255_{10}$). Thus, the absolute value designated in equation 7 is a saturated absolute value having an upper limit of OXFF. The 16 most significant bits of this 17 bit branch metric are retained for the add-compare-select operation of the Viterbi algorithm in a manner detailed below.

The in-phase and quadrature phase parts of the received complex signal are stored in register bank 31. In addition, the complex estimated channel taps and the generating polynomials may be stored in the same register bank.

As discussed previously, two types of computation are implemented for convolutional decoding. Convolutional decoding over a gaussian channel is supported with an Euclidean metric for rate 1/1 and 1/2 convolutional encoding in unit 27. Convolutional decoding preceded by MLSE equalization or other linear/non-linear equalization is supported with a Manhattan distance measure for rates 1/1 through 1/6 convolutional encoding in unit 29.

Received 8 bit signals S(5) through S(0) are stored in register bank 31. Furthermore, generating polynomials G(1) through G(5) are stored in register bank 31. Generating polynomials G(0) through G(5), corresponding to a constraint length of seven, may take part in computing the estimated received signals, E(0,k), . . . , E(5,k) within the ECCP associated with an possible state transitions for k=0, 1, . . . $2^{C-1}$.

Six 8 bits of symbols S(0), . . . , S(5), are loaded into ECCP 13. The incremental branch metrics associated with all $2^C$ state transitions are calculated as indicated in Table 1.

Figure 2:
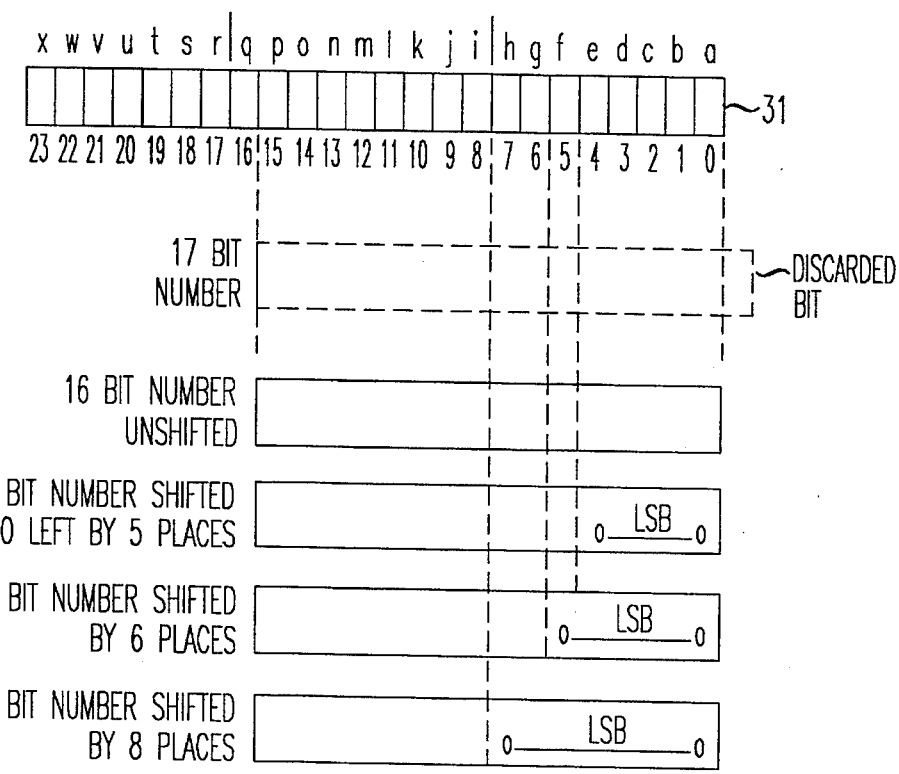
FIG. 2 is a diagram of a register used in an illustrative embodiment of the present invention.

The results of the branch metric calculation performed by either unit 25, 27 or 29 are stored in a 24 bit register depicted in FIG. 2. Position a of the register shown in FIG. 2 contains the least significant bit. Position a is filled first, then position b, then position c, and so on. However, the size of the branch metric value calculated by units 25, 27 or 29 may vary depending upon signal dynamics (if MLSE is performed) or upon code rate (if convolutional decoding is performed). Consequently, it is impossible to predict in which bit position the most significant bit(s) will appear in the register of FIG. 2.

TABLE 1

| Distance Measure | Code Rate | 16 Bit Aligned Incremental Branch Metric; (and shift) |
|---|---|---|
| 1. Euclidean | 1/1 | $(S(o) - E(o))^2$ |
| 2. Euclidean | 1/2 | $\left[ \sum_{i=0}^{i=1} S(i) - E(i) \right]^2 ; >> 1$ |
| 3. Manhattan | 1/1 | $\|S(o) - E(o)\|; << 8$ |
| 4. Manhattan | 1/2 | $\left| \sum_{i=0}^{i=1} S(i) - E(i) \right|; << 7$ |
| 5. Manhattan | 1/3 or 1/4 | $\left| \sum_{i=0}^{2 \text{ or } 3} S(i) - E(i) \right|; << 6$ |
| 6. Manhattan | 1/5 or 1/6 | $\left| \sum_{i=0}^{4 \text{ or } 5} Si(i) - E(i) \right|; << 5$ |

It is desired that only 16 bit numbers be processed for branch metrics. Consequently, whatever the result of the branch metric calculation performed in Table 1, that result is shifted in the register of FIG. 2 until the most significant bit appears in position P. For example, the result of an Euclidean branch metric calculation with a 1/1 code rate may be expected to be a 16 bit number. Thus, the most significant bit would be in position P of the register of FIG. 2. For an Euclidean branch metric having a code rate 1/2, a 17 bit number may be expected. Consequently (as noted in Table 1), the 17 bit number having its most significant bit in position q of the register of FIG. 2 is shifted one position (using, for example, a barrel shifter) to the right so that its most significant bit is in position P of the register of FIG. 2. The least significant bit is lost. The shift of the branch metric number to the right by one position is indicated in Table 1 by the symbol >>1. If a Manhattan branch metric having a code rate of 1/1 is calculated, it may be expected to be an 8 bit number. Consequently, the 8 bit number is shifted in register 2 by eight places to the left to again align its most significant bit with position P of the register of FIG. 2. Should a Manhattan branch metric having a code rate of 1/2 be calculated, it may be expected to be a 9 bit number. The 9 bit number is shifted seven positions to the left to bring its most significant bit in line with position with position P of the register of FIG. 2. If a Manhattan branch metric having a code rate of 1/3 or 1/4 is calculated, it may be expected to be a 10 bit number. The 10 bit number is shifted six spaces to the left. If a Manhattan branch metric having a code rate of 1/5 or 1/6 is calculated, it may be expected to be an 11 bit number. The 11 bit number is shifted five spaces to the left so that its most significant bit is aligned with position P of FIG. 2. As indicated in FIG. 1, the 16 bit binary numbers representing the results of individual branch metric calculations are provided by branch metric unit 15 to update unit 17 for cost accumulation. Thus, in general, the most significant bit of the branch metric calculation is aligned with bit position P in FIG. 2. Effectively, the result of each branch metric calculation is converted to a 16 bit number within branch metric unit 15.

Branch metrics for each state transition are transmitted to update unit 17. Update unit 17 adds the appropriate branch metric for each state transition to the appropriate accumulated cost. For example, with reference to FIG. 3 which depicts a portion of a Viterbi trellis, update unit 17 adds the 16 bit branch metric, BM0, for the transition between state 101 and 103 to the accumulated cost combination AC0, associated with state 101. Furthermore, update unit adds the branch metric BM1, associated with the state transition between state 102 and 103, to the accumulated cost AC1 associated with state 102. As mentioned before, each branch metric, BM0 and BM1, has been adjusted to make it a 16 bit number.

Figure 4:
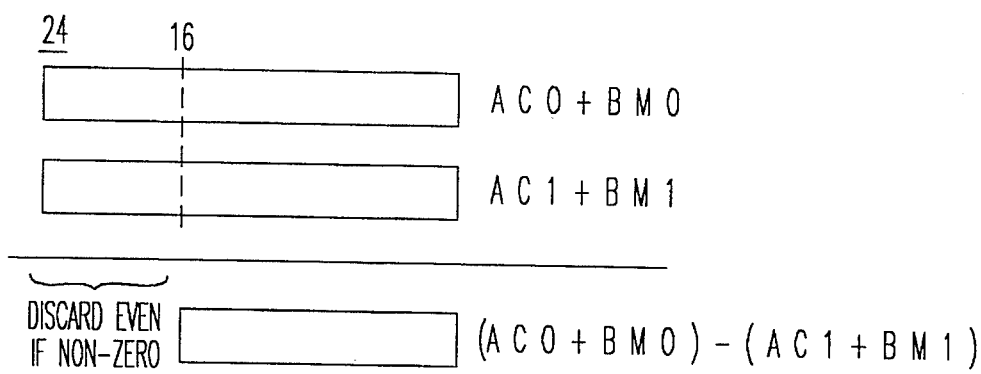
FIG. 4 is a diagram illustrating calculation of the accumulated cost difference.

Update unit 17 compares the accumulated costs associated with each potential state transition to determine which transition is the survivor. Both accumulated costs, AC0 and AC1 are 24 bit numbers, typically. Usually, AC0 and AC1 are nearly equal. Update unit 17 calculates the difference between accumulated costs (AC0+BM0)−(AC1+BM1). Because AC0 and AC1 are nearly equal, the seventeenth through twenty-fourth bits are discarded. Consequently, the accumulated cost difference for the surviving transition state 103, depicted in FIG. 4, is a 16 bit number. Depending upon the sign of the accumulated cost difference, it can be determined whether state 103 has reached from either state 101 or state 102.

Figure 3:
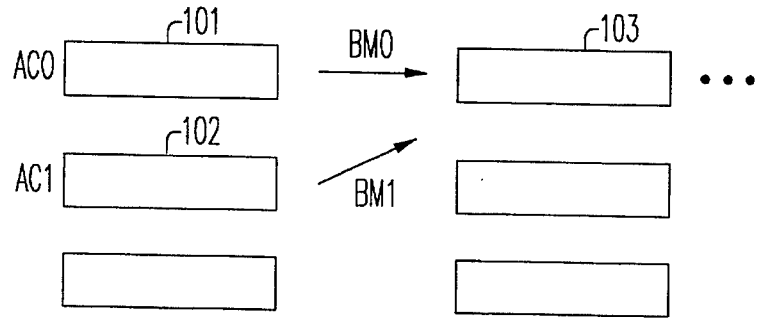
FIG. 3 is a diagram showing a portion of a Viterbi trellis useful in understanding embodiments of the present invention.

Traceback unit 19 performs a traceback through the Viterbi trellis yielding the proper decoded symbols for each simple instant. If desired, a binary "hard" symbol may be obtained for each symbol instant. Therefore, the decoded symbol for each symbol instant may be either a 0 or a 1. However, if desired, traceback unit may be directed by the DSP core 32 to provide a soft symbol decoded output. It may be observed that if the difference in accumulated cost between the transition from state 101 to state 103 and the transition from state 102 to state 103 is large, then there is a high probability that the transition to state 103 is the correct transition. By contrast, should the difference between accumulated costs associated with different state transitions be small, there is a greater degree of uncertainty about which transition is appropriate, i.e., there is a lower probability that the ultimately selected transition may be correct. The present invention provides a method of soft symbol decoding that reflects these probabilities. Accordingly, if either the traceback bit (i.e., the least significant bit of the present state, such as state 101 or 102 or, in another embodiment, the most significant bit of the next state, 103) is a 1, then, as depicted in FIG. 5, the seven most significant bits of the accumulated cost difference depicted in FIG. 4 are concatenated to the fight of the traceback bit (or, in another embodiment, the most significant bit of the next state). However, if the traceback bit (or, in another embodiment, the most significant bit of the next state) is a 0, then the complement of the accumulated cost difference obtained in FIG. 3 is concatenated to the right of the traceback bit (or, in another embodiment, the most significant bit of the next state) as depicted in FIG. 5. In either case, the resulting 8 bit soft symbol contains not only a binary 1 or 0, but also a 7 bit probability component. As is known by those of skill in the art, soft decoded symbols are ultimately less error prone. For example, should the traceback bit (or the most significant bit of the next state) be a 1, concatenation of the traceback bit (or the most significant bit of the next state) with the most significant 7 bits of the accumulated cost difference yields a number having a value between 255 and 128, as shown in FIG. 7. Similarly, if the traceback bit is a 0, the complement of the accumulated cost difference, when concatenated with the 0 traceback bit, yields a number between 0 and 127.

FIG. 7 is a diagram indicating the range of values for soft output decisions. A soft 0 may range from 0 (00000000) to 127 (01111111). A 1 may range from 128 (10000000) to 255 (11111111).

Alternatively, the circuit of FIG. 6 may also be used to provide a hard decision output, of course, without concatenation.

Circuitry for implementation of the soft decision output is illustrated in FIG. 6. Multiplexer 207 receives the least significant bit of the present state (i.e., the traceback bit or most significant bit of the next state), and is capable of providing output 203, i.e., a hard bit traceback output. However, XNOR gates 205, 206, 207, 208, 209, 210 and 211 serve to concatenate the most significant 7 bits of register 213 containing the absolute value of the accumulated cost difference (depicted in FIG. 3), thereby providing the previously indicated soft output depicted in FIG. 1.

We claim:

1. A method of trellis decoding comprising:

determining a set of two or more branch metric components, X1 and XQ;

determining if any of said branch metric components X1, XQ of said set exceeds a predetermined saturation value;

setting any branch metric component of said set which exceeds said predetermined value to said predetermined saturation value.

2. The method of claim 1 in which said predetermined value is OXFF.

3. A method of trellis decoding comprising:

determining two or more branch metric values associated with state transitions in a Viterbi trellis;

said branch metric values having a maximum of n bits;

forming a k bit number associated with each of said branch metric value by:

if k<n, discarding the n−k least significant bits;

if k>n, shifting each of said branch metric bits so that their most significant bits is the k th bit position and concentrating zeros in the least significant bit positions, thereby obtaining two to more modified branch metrics, each having k bits.

4. The method of claim 3 further including:

adding each of said modified branch metrics to an appropriate accumulated cost, thereby obtaining two updated accumulated costs, having j bits, j>n;

subtracting one of said updated accumulated costs from the other, thereby obtaining an accumulated cost difference;

taking the absolute value of said accumulated cost difference;

discarding a predetermined number of the most significant bits of said absolute value of said accumulated cost difference thereby obtaining a modified absolute accumulated cost difference.

5. The method of claim 4 further including:

determining the traceback bit for each symbol instant associated with said Viterbi trellis; and, if traceback bit is a 1, concentrating said traceback bit at the MSB with said modified absolute accumulated cost difference, thereby obtaining a soft symbol output; and if said traceback bit is 0, concentrating said traceback bit at the MSB with the ones complement of said modified absolute accumulated cost difference, thereby obtaining a soft symbol output.

6. The method of claim 4 in which n=17, k=16, j=24 and said accumulated cost difference has 24 bits and said modified absolute accumulated cost difference has 7 bits.

7. The method of claim 4 further including:

determining the most significant bit of another state of the Viterbi trellis for each symbol instant and, if said most significant bit of the said another state of the Viterbi trellis is a 1, concatenating said most significant bit of the said another state Viterbi trellis with said modified absolute accumulated cost difference, thereby obtaining a soft symbol output;

and if said most significant bit of the said another state of the Viterbi is a 0, concatenating said most significant bit of the said another state of the Viterbi trellis with a ones complement of said modified absolute accumulated cost difference, thereby obtaining a soft symbol output.

* * * * *